(12) United States Patent
Akiyama et al.

(10) Patent No.: US 10,290,779 B2
(45) Date of Patent: May 14, 2019

(54) LIGHT EMITTING ELEMENT

(71) Applicant: Panasonic Intellectual Property Management Co., Ltd., Osaka (JP)

(72) Inventors: Shinnosuke Akiyama, Osaka (JP); Kei Toyota, Osaka (JP); Masato Mori, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/825,058

(22) Filed: Nov. 28, 2017

(65) Prior Publication Data

US 2018/0175257 A1    Jun. 21, 2018

(30) Foreign Application Priority Data

Dec. 15, 2016 (JP) .................. 2016-243649
Aug. 4, 2017 (JP) .................. 2017-151918

(51) Int. Cl.
| | |
|---|---|
| *H01L 33/54* | (2010.01) |
| *H01L 33/26* | (2010.01) |
| *H01L 33/56* | (2010.01) |
| *H01L 33/58* | (2010.01) |
| *C01F 7/02* | (2006.01) |
| *C01F 17/00* | (2006.01) |
| *H01L 33/50* | (2010.01) |

(52) U.S. Cl.
CPC .............. *H01L 33/54* (2013.01); *C01F 7/02* (2013.01); *C01F 17/0025* (2013.01); *H01L 33/26* (2013.01); *H01L 33/56* (2013.01); *H01L 33/58* (2013.01); *H01L 33/50* (2013.01); *H01L 2933/0058* (2013.01); *Y02B 20/181* (2013.01)

(58) Field of Classification Search
CPC ......... H01L 33/54; H01L 33/26; H01L 33/56; H01L 33/58; C01F 7/02; C01F 17/0025
See application file for complete search history.

(56) References Cited

U.S. PATENT DOCUMENTS

| | | | | |
|---|---|---|---|---|
| 7,102,152 B2* | 9/2006 | Chua | ........ | B82Y 10/00 257/14 |
| 7,297,293 B2* | 11/2007 | Tamaki | ........ | C01B 21/0602 252/301.4 F |
| 7,332,746 B1* | 2/2008 | Takahashi | ........ | H01L 25/0753 257/98 |
| 8,026,115 B2* | 9/2011 | Barnes | ........ | B82Y 20/00 106/287.16 |

(Continued)

FOREIGN PATENT DOCUMENTS

| | | |
|---|---|---|
| JP | 2012-015254 | 1/2012 |
| JP | 2012-185403 | 9/2012 |

(Continued)

*Primary Examiner* — Ida M Soward
(74) *Attorney, Agent, or Firm* — Wenderoth, Lind & Ponack, L.L.P.

(57) ABSTRACT

A light emitting element includes a light emitting member that is formed of at least two kinds of an oxide material and has a plate shape; and a light transmitting member that collimates a light emitted from the light emitting member and has a plano-convex shape, in which a contact portion between the light transmitting member and the light emitting member is continuous.

4 Claims, 3 Drawing Sheets

(56) References Cited

U.S. PATENT DOCUMENTS

| | | | | |
|---|---|---|---|---|
| 8,044,421 B2* | 10/2011 | Offermans | ............... | H01L 33/58 257/98 |
| 8,178,888 B2* | 5/2012 | Chakraborty | ........... | H01L 33/50 257/98 |
| 8,637,893 B2* | 1/2014 | Kim | ................ | H01L 33/486 257/88 |
| 8,901,586 B2* | 12/2014 | Kim | ................ | H01L 33/58 257/81 |
| 9,190,577 B2* | 11/2015 | Hwang | ................ | H01L 33/54 |
| 9,190,579 B2* | 11/2015 | Sato | ................ | H01L 33/505 |
| 9,196,810 B2* | 11/2015 | Odnoblyudov | ..... | H01L 33/0079 |
| 9,419,182 B2* | 8/2016 | Schubert | ............. | H01L 33/0079 |
| 9,786,822 B2* | 10/2017 | Margalit | ................ | H01L 33/382 |
| 2002/0064661 A1* | 5/2002 | Takeda | ................ | C03C 17/02 428/426 |
| 2008/0192472 A1* | 8/2008 | Verschuuren | ........... | H01L 33/58 362/257 |
| 2009/0212314 A1* | 8/2009 | Im | ................ | C09K 11/7774 257/98 |
| 2009/0294788 A1* | 12/2009 | Rosler | ................ | C09K 11/02 257/98 |
| 2010/0207139 A1* | 8/2010 | Winkler | ................ | B82Y 20/00 257/98 |
| 2012/0001214 A1 | 1/2012 | Ooyabu et al. | | |
| 2012/0068213 A1* | 3/2012 | Zhang | ................ | B32B 18/00 257/98 |
| 2012/0262052 A1* | 10/2012 | Oshio | ................ | C04B 35/581 313/483 |
| 2012/0275135 A1* | 11/2012 | Kasakura | ........... | C09K 11/0883 362/84 |
| 2013/0320375 A1 | 12/2013 | Wang et al. | | |
| 2014/0084322 A1* | 3/2014 | Park | ................ | H01L 33/486 257/98 |
| 2014/0239332 A1* | 8/2014 | Iwakura | ................ | H01L 33/50 257/98 |
| 2015/0060925 A1* | 3/2015 | Kim | ................ | H01L 33/385 257/98 |
| 2015/0263252 A1* | 9/2015 | Wang | ................ | H01L 51/5262 257/98 |
| 2016/0118552 A1* | 4/2016 | Kim | ................ | H01L 33/54 438/7 |
| 2016/0149097 A1 | 5/2016 | Saka et al. | | |
| 2016/0218240 A1* | 7/2016 | Bouvier | ............. | H01L 33/0079 |
| 2016/0218254 A1* | 7/2016 | Jacobson | ............. | H01L 33/504 |
| 2016/0343920 A1* | 11/2016 | Seo | ................ | H01L 51/5275 |
| 2017/0037313 A1* | 2/2017 | Hirosaki | ................ | H01J 11/42 |

FOREIGN PATENT DOCUMENTS

| | | |
|---|---|---|
| JP | 2014-093435 | 5/2014 |
| JP | 2016-100485 | 5/2016 |

* cited by examiner

LIGHT EMITTING ELEMENT

BACKGROUND

1. Technical Field

The present disclosure relates to a light emitting element mainly used for an optical product and a method of manufacturing a light emitting element.

2. Description of the Related Art

In the related art, a discharge light source such as an extra-high pressure mercury lamp using light emission of arc discharge in mercury vapor has been generally used for optical products such as lighting and a projector. The discharge light source is advantageous in that continuous spectrum light from an ultraviolet region to a visible region can be emitted. On the other hand, the discharge light source is disadvantageous in that continuous lighting time is short and lighting in a moment is not possible. In order to solve the disadvantage, using a light source replacing the discharge light source currently increases.

As a new light source replacing the discharge light source, a white light emitting diode (white LED) or a laser diode (LD) is proposed. The LED or LD is a light source configured by combining an excitation light source emitting light having a certain specific length and a phosphor emitting fluorescence by absorbing the light from the excitation light source. In general, a configuration in which light from a blue light source and light from a yellow phosphor are synthesized to obtain the white light is known.

The white light obtained from the configuration includes not only light traveling straight in an outgoing direction from a surface of the phosphor but also light diffused in the outgoing direction. Therefore, in order to control light emission output from the products such as lighting and a projector, it is required to perform an optical control by combining a lens with the light source.

Japanese Patent Unexamined Publication No. 2012-185403 discloses a device having a configuration in which a light emitting layer including a powdery phosphor is formed on a board. The powdery phosphor emits yellow light by absorbing blue light emitted from an LED. FIG. 5 shows an example of the device described in Japanese Patent Unexamined Publication No. 2012-185403. The device includes board 121, light emitting layer 122 on board 121, and light transmitting member 123 having a plano-convex shape. In light emitting layer 122, powdery phosphor 120 is dispersed in binder 119. Air layer 118 is included in light emitting layer 122.

SUMMARY

A light emitting element of the present disclosure includes a light emitting member that is formed of at least two kinds of an oxide material and has a plate shape; and a light transmitting member that collimates a light emitted from the light emitting member and has a plano-convex shape, in which a contact portion between the light transmitting member and the light emitting member is continuous.

According to the light emitting element of the present disclosure, since the contact portion between the light emitting member and the light transmitting member is continuous, a refraction of fluorescence does not occur in a space between the light emitting member and the light transmitting member. Accordingly, it is possible to prevent a fluorescence output from decreasing, and to realize a light emitting element in which a crack does not occur at the contact portion between the light emitting member and the light transmitting member.

DETAILED DESCRIPTION

Figure 1:
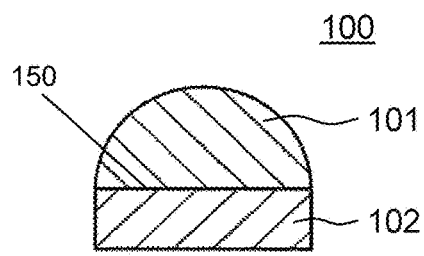
FIG. 1 is schematic sectional diagram illustrating a sectional configuration of a light emitting element of Embodiment 1.

Prior to the description of an embodiment, problems in the related art are briefly described.

In light emitting layer 122 of a device disclosed in Japanese Patent Unexamined Publication No. 2012-185403, powdery phosphor 120, binder 119 exhibiting a property as an adhesive, and air layer 118 occupy a space between light transmitting member 123 having a plano-convex shape and board 121.

In a case where light emitting layer 122 is irradiated with blue light from the LED or LD in a direction from board 121 to light transmitting member 123 having the plano-convex shape, powdery phosphor 120 absorbs the blue light and emits yellow light. In this case, the yellow light is transmitted other powdery phosphor 120 or binder 119, but a refractive index is different at each material of powdery phosphor 120 and binder 119. Therefore, light diffusion occurs not only in a direction to light transmitting member 123 having the plano-convex shape, but also in a horizontal direction of light emitting layer 122. Accordingly, a sufficient light extracting efficiency cannot be obtained, and a fluorescence output of light that can be detected in a direction to light transmitting member 123 having the plano-convex shape decreases.

In addition, in a case where the device is irradiated with excitation light having a high output, such as the light of the LD, temperature of the device itself rapidly increases. In a case where air layer 118 is present in light emitting layer 122 between light transmitting member 123 having the plano-convex shape and board 121, air layer 118 expands due to a rapid increase of the temperature of the device, thereby occurring a crack on light emitting layer 122. Accordingly, a proportion of air layer 118 increases and light diffusion further occurs. Therefore, the fluorescence output further decreases.

The present disclosure is to solve the problems, and is to provide a light emitting element and method of manufacturing a light emitting element. The light emitting element includes a light transmitting member and a light emitting member, and prevents the fluorescence output from decreasing.

A light emitting element of a first aspect includes a light emitting member that is formed of at least two kinds of an oxide material and has a plate shape; and a light transmitting member that collimates a light emitted from the light emitting member and has a plano-convex shape, in which a contact portion between the light transmitting member and the light emitting member is continuous.

In the first aspect, in the light emitting element of a second aspect, the light emitting member is formed of at least one material not having a luminescent center and a material having the luminescent center, and the light transmitting member is formed of a material substantially the same as the material of the light emitting member, not having the luminescent center.

According to the configuration, it is possible to obtain continuity in the contact portion between the light transmitting member and the light emitting member by a common material.

In the second aspect, in the light emitting element of a third aspect, the material not having the luminescent center and the material having the luminescent center is distributed in a state of being three-dimensionally entwined with each other, in the contact portion.

According to the configuration, it is possible to efficiently conduct heat generated in the oxide material of the light emitting member, having the luminescent center to the oxide material not having the luminescent center, and to dissipate the heat.

In the second or third aspect, in the light emitting element of a fourth aspect, the material not having the luminescent center may be $Al_2O_3$, and the material having the luminescent center may be $Y_3Al_5O_{12}$ containing Ce.

According to the configuration, in a case where a molten liquid is coagulated in a vicinity of a eutectic point of the $Al_2O_3$ and the $Y_3Al_5O_{12}$ containing Ce, the two materials form a densely entwined structure. Therefore, an effect of improving a mechanical strength is obtained.

A method of manufacturing a light emitting element of a fifth aspect, in which a contact portion between a light transmitting member and a light emitting member is continuous, includes: heating each powder, which is to be the molten liquid of the light emitting member, of an aluminum oxide, a yttrium oxide, and a cerium oxide in a crucible; bringing a planar portion of the light transmitting member having the plano-convex shape in contact with a bottom hole of the crucible; and after checking a state that the molten liquid of the light emitting member wets the planar portion of the light transmitting member, coagulating the molten liquid of the light emitting member by increasing a space between the crucible and the light transmitting member.

In the fifth aspect, in the method of manufacturing a light emitting element of a sixth aspect, the molten liquid of the light emitting member is as follows. An Al molar fraction is 75 mol % to 85 mol %, a Ce molar fraction is 0.02 mol % to 0.4 mol %, and a balance includes Y. In the manufactured light emitting element, a thickness of the light emitting member is set to 0.1 mm to 0.35 mm.

The thickness of the light emitting member noted here is defined as a value obtained by subtracting the thickness of the light transmitting member from the entire thickness of the light emitting element.

According to the configuration, the light emitting element excellent in the fluorescence output and the fluorescence output maintenance factor is obtained.

Hereinafter, the light emitting element of the embodiment will be described in detail with reference to the accompanying drawings. Substantially the same components in the drawings are denoted by the same reference marks.

Embodiment 1

FIG. 1 is schematic sectional diagram illustrating a sectional configuration of light emitting element 100 of Embodiment 1.

Light emitting element 100 of the present embodiment includes light emitting member 102 that is formed of at least two kinds of an oxide material and has a plate shape and light transmitting member 101 that collimates a light emitted from light emitting member 102 and has a plano-convex shape. In light emitting element 100, the contact portion 150 between light emitting member 102 and light transmitting member 101 is continuous.

If light emitting member 102 and light transmitting member 101 are bonded through binder 119 described in Japanese Patent Unexamined Publication No. 2012-185403, refraction occurs in the light emitted from the light emitting member 102 side at a boundary with binder 119. According to the refraction, some of the light emitted toward light transmitting member 101 having the plano-convex shape is diffused in a side surface direction of light emitting member 102. Therefore, the fluorescence output that can be detected after transmitting light transmitting member 101 decreases. Differently to the related art, light emitting element 100 has a configuration not including binder 119 in the contact portion between light transmitting member 101 and light emitting member 102. Therefore, it is possible to prevent the fluorescence output from decreasing.

Figure 2:
FIG. 2 is a diagram illustrating a detailed structure of a contact portion between a light transmitting member and a light emitting member which configure the light emitting element of Embodiment 1.

In addition, the contact portion between light emitting member 102 and light transmitting member 101 is continuous. FIG. 2 shows a contact portion between light transmitting member 101 and light emitting member 102 which configure light emitting element 100. As shown in FIG. 2, in the contact portion, oxide material 103 not having the luminescent center and oxide material 104 having the luminescent center is distributed so as to be three-dimensionally entwined with each other. The contact portion is continuous.

In a case where light emitting member 102 is irradiated with the excitation light of high output, electrons at a ground level of luminescent material (phosphor and oxide material 104 having the luminescent center) are excited, and the electrons transits to the excitation level. The transited electrons emit the fluorescence when returning to the ground level. However, in this process, unused energy is converted to heat. Then, since the luminescent material (phosphor and oxide material 104 having the luminescent center) generates the heat, the temperature of light emitting member 102 increases. Although light transmitting member 101 is not a heat generating source, since light transmitting member 101 is continuous with light emitting member 102, the temperature of light transmitting member 101 increases and the temperature of light emitting element 100 increases in general.

Accordingly, light emitting member 102 and light transmitting member 101 expand due to the heat. In a case of the related art where the contact portion between light emitting member 102 and light transmitting member 101 does not have a continuous structure, the crack occurs in the contact portion between light emitting member 102 and light transmitting member 101 in some cases. On the other hand, light emitting element 100 of Embodiment 1 has a configuration in which the contact portion between light emitting member 102 and light transmitting member 101 having the plano-convex shape is continuous. Accordingly, even in a case where thermal expansion occurs in light emitting member 102, since the contact portion between light emitting member 102 and light transmitting member 101 is continuous, stress moderates by favorable thermal conduction to light transmitting member 101. Therefore, it is possible to prevent the crack in the contact portion from occurring.

It is desirable that light transmitting member 101 is oxide material 103 not having the luminescent center. It is desirable that oxide material 103 not having the luminescent center is contained in light emitting member 102. In other words, it is desirable that light emitting member 102 includes oxide material 103 not having the luminescent center and oxide material 104 having the luminescent center and light transmitting member 101 includes a material substantially the same as oxide material 103, contained in light emitting member 102, not having the luminescent center. According to the configuration, it is possible to obtain the continuity in the contact portion between light transmitting member 101 and light emitting member 102 by oxide material oxide material 103 not having the luminescent center, which is the common material, not having the luminescent center. In a case where oxide material 104 having the luminescent center is also contained to light transmitting member 101, since some of fluorescent components of light emitting member 102 are caused to self-absorb, the problem that the fluorescence output decreases occurs.

In addition, it is preferable that at least one material of the materials constituting light emitting member 102 is oxide material 103 not having the luminescent center, and balance includes oxide material 104 having the luminescent center. It is preferable that oxide material 103 and oxide material 104 are three-dimensionally entwined with each other in the contact portion between oxide material 103 and oxide material 104.

As described above, in a case where light emitting member 102 is irradiated with excitation light of high output, the heat is generated in light emitting member 102. In a case where all light emitting members 102 are formed of oxide material 104 having the luminescent center, the heat is generated from all light emitting members 102. There is a phenomenon referred to as temperature quenching. In the phenomenon, in a case where the temperature increases by one property of phosphor such as oxide material 104 having the luminescent center, the fluorescence output decreases. Thus, in order to prevent the fluorescence output from decreasing, it is required to make a structure that can efficiently dissipate the heat.

In light emitting member 102, oxide material 103 not having the luminescent center and oxide material 104 having the luminescent center form a three-dimensionally entwined structure. Therefore, it is possible to increase a contacting area of each of oxide material 103 and oxide material 104. Accordingly, it is possible to efficiently conduct the heat generated in 104 of the light emitting member 102, having the luminescent center to oxide material 103 not having the luminescent center, and to dissipate the heat.

It is preferable that oxide material 103 not having the luminescent center is, for example, $Al_2O_3$. It is more preferable that oxide material 104 having the luminescent center is, for example, $Y_3Al_5O_{12}$ containing Ce (hereinafter, designated by YAG).

Examples of oxide material 103 not having the luminescent center include $Al_2O_3$ or $ZrO_2$, MgO, and $Y_2O_3$. Among these, it is desirable to use the $Al_2O_3$ having high thermal conductivity.

Examples of oxide material 104 having the luminescent center include a material in which $Er_3Al_5O_{12}$, $Y_3Al_5O_{12}$, or $Yb_3Al_5O_{12}$ each having a garnet structure contains Ce. It is desirable to use a material in which the YAG excellent in optical property contains Ce. In particular, it is preferable to combine $Al_2O_3$ as oxide material 103 not having the luminescent center and YAG containing Ce as oxide material 104 having the luminescent center. In a case where the $Al_2O_3$ and YAG containing Ce are combined, when the molten liquid is coagulated in the vicinity of a eutectic point of the $Al_2O_3$ and YAG, the two materials form a densely entwined structure. Therefore, an effect of improving a mechanical strength is obtained.

Hereinafter, description will be made more specifically based on examples.

Method of Manufacturing Light Emitting Element

Figure 3A:
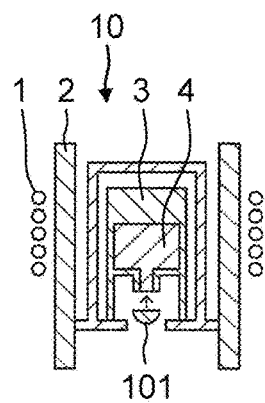
FIG. 3A is a schematic diagram illustrating a pulling-down process for obtaining the light emitting element of Embodiment 1.
Figure 3B:
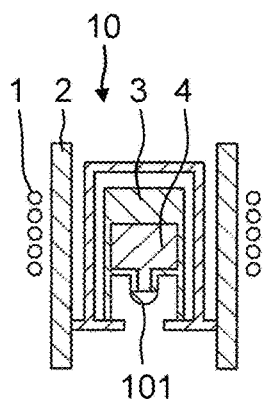
FIG. 3B is a schematic diagram illustrating a pulling-down process for obtaining the light emitting element of Embodiment 1.
Figure 3C:
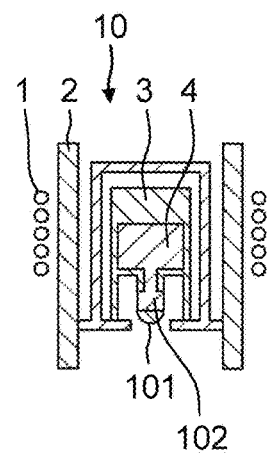
FIG. 3C is a schematic diagram illustrating a pulling-down process for obtaining the light emitting element of Embodiment 1.

In order to produce light emitting element 100 of Embodiment 1, crystal pulling-down device 10 was used. FIGS. 3A to 3C are schematic diagrams illustrating a pulling-down process of Embodiment 1. Crystal pulling-down device 10 includes high frequency coil 1, refractory material 2, and crucible 3 having molten liquid 4 inside. Crystal pulling-down device 10 includes high frequency coil 1 as a heating source. Crucible 3 provided in crystal pulling-down device 10 is heated according to the principle of high frequency induction heating (FIG. 3A). Crucible 3 is covered with refractory material 2 for keeping warm. Therefore, molten liquid 4 in crucible 3 is heated without physical contact with high frequency coil 1. A small hole is open on a bottom surface of crucible 3. The planar portion of light transmitting member 101 is caused to contact to the bottom surface of crucible 3 (FIG. 3B). After checking that molten liquid 4 wets and spreads on a surface of light transmitting member 101, molten liquid 4 is caused to be coagulated by pulling down light transmitting member 101 (FIG. 3C). The method is not limited to a case of pulling down light transmitting member 101. A method of pulling up crucible 3 may be used. At least one of light transmitting member 101 and crucible 3 may be moved to increase the space between light transmitting member 101 and crucible 3. Accordingly, light emitting element 100 including light transmitting member 101 and light emitting member 102 which are continuous, is obtained.

EXAMPLE

An aluminum oxide powder, a yttrium oxide powder, and a cerium oxide powder, which are raw materials of molten liquid 4 and have a purity of 99.9%, were mixed in a predetermined ratio and put the powders in crucible 3. The mixed powder was melted by increasing an output of high frequency coil 1 in a nitrogen gas atmosphere. At this time, melting temperature was set to 1,900° C. or higher so as to completely melt the raw material powder. Next, light transmitting member 101 was caused to contact with the bottom portion of crucible 3. Then, molten liquid 4 started to wet the planar portion of light transmitting member 101 from the bottom of crucible 3. After checking that molten liquid 4 wet and spread on an entire planar portion, molten liquid 4 was coagulated by slowly pulling down light transmitting member 101. Accordingly, light emitting element 100 including light transmitting member 101 and light emitting member 102 which were continuous was produced.

In order to clarify the effect of the light emitting element of the present embodiment, by changing a kind or an amount of the raw material powders, the light emitting elements different in the kind or composition of materials of light emitting member 102 were produced.

Pulling-down light emitting member 102 was completed to have a required thickness, and then the output of high frequency coil 1 stopped. In this case, since molten liquid 4 in crucible 3 was cooled, flowing of molten liquid 4 out of the bottom portion of crucible 3 stopped. Next, an inside of the device was subjected to natural cooling, and light emitting element 100 including light transmitting member 101 and light emitting member 102 was picked up. Finally, light emitting element 100 having a desired thickness was produced by polishing the light emitting member 102 side of light emitting element 100 picked up.

The fluorescence output and fluorescence output maintenance factor of obtained light emitting element 100 were evaluated.

First, the concentration of yttrium, aluminum, and cerium which are contained in light emitting element 100 was measured, using ICP emission spectral analysis method, by extracting a portion on the light emitting member 102 side with respect to obtained light emitting element 100. The molar fraction of each element was calculated based on the concentration obtained by ICP emission spectral analysis. Here, total concentration of each element of aluminum Al, Cerium Ce, and yttrium Y excluding oxygen O was assumed as 100 mol %.

Measuring Device

Figure 4:
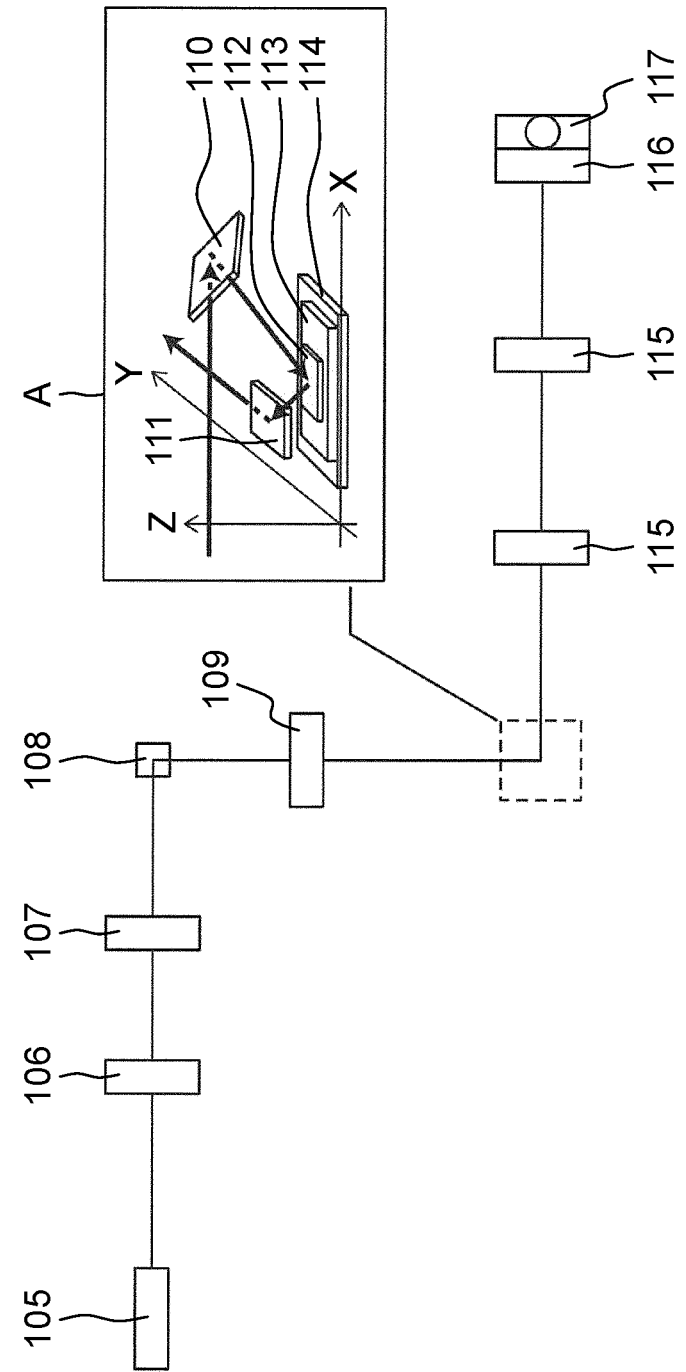
FIG. 4 is a schematic diagram illustrating a measuring device used for measuring a fluorescence output and a fluorescence output maintenance factor of the light emitting element described in Embodiment 1.
Figure 5:
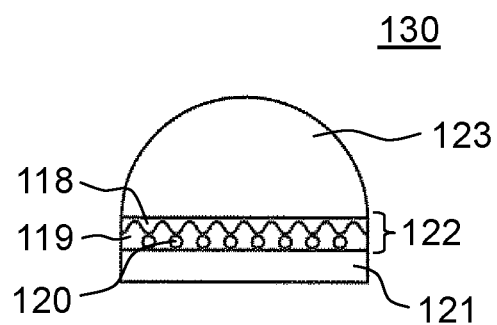
FIG. 5 is a schematic diagram illustrating an example of a device of the related art.

FIG. 4 is a schematic diagram illustrating a device used for measuring the fluorescence output and the maintenance factor of the fluorescence output of measurement sample 112 of the manufactured light emitting element. The measuring device includes blue laser 105, polarizing plate 106, shutter 107, prism 108, f200 lens 109, half mirror 110, mirror 111, measurement sample 112, reflector 113, heating device 114, f75 lens 115, blue light cut filter 116, and photodetector 117. Partial view A in FIG. 4 is a partial diagram illustrating a configuration of half mirror half mirror 110, mirror 111, measurement sample 112, reflector 113, and heating device 114 which are disposed between f200 lens 109 and f75 lens 115.

The fluorescence output of produced each light emitting element 100 was measured using the device at a room temperature. Blue laser 105 having a wavelength of 445 nm was used as the excitation light. Light intensity of blue laser 105 was adjusted using polarizing plate 106, prism 108, and half mirror 110 such that the intensity of light, with which measurement sample 112 was irradiated, was adjusted to 300 mW. On and off of the light of blue laser 105 was controlled by shutter 107. In addition, in order to irradiate measurement sample 112 with laser light having a diameter of Φ0.7 mm, the light was controlled using f200 lens 109. As shown in partial view A in FIG. 4, in order to extract the fluorescence emitted toward a lower portion by reflecting, reflector 113 was provided on the lower portion of measurement sample 112. Heating device 114 was present under the reflector 113. It was possible to change the temperature of measurement sample 112. The converted fluorescence was reflected from mirror 111 and became collimated light at f75 lens 115. The fluorescence output was detected by photodetector 117. At this time, since the light also included the blue light from blue laser 105, the blue light was removed in blue light cut filter 116 such that the fluorescence output of the fluorescence component from measurement sample 112 can be detected.

The fluorescence output was evaluated as A (good) in a case of being 30.0 mW or more that is required for applying to the optical product, and was evaluated as B (fail) in a case of being less than 30.0 mW.

In addition, the fluorescence output of measurement sample 112 was evaluated at 200° C. A value obtained using "(value of fluorescence output at 200° C.)/(value of fluorescence output at room temperature)×100" was calculated as the fluorescence output molar fraction. The fluorescence output molar fraction was evaluated as A (good) in a case of being 90.0% or more (this value can guarantee the property as a product, even in a case where the temperature of the inside of the optical product increases), and was evaluated as B (fail) in a case of being less than 90.0%.

In Table 1, evaluation results of the fluorescence output and the fluorescence output molar fraction of the light emitting element are respectively shown. In the test, the fluorescence output and the fluorescence output molar fraction were obtained while the Al molar fraction in the light emitting member, the Ce molar fraction in the light emitting member, the thickness of the light emitting member, the method of manufacturing light emitting element, and the like were changed.

In the fluorescence output molar fraction at 200° C. and the fluorescence output, in a case where the number of A (good) was two, the comprehensive result was evaluated as A (good). In a case where the number of B (fail) was even one, regardless of the result of the other item, the comprehensive result was evaluated as B (fail).

TABLE 1

| | Al molar fraction (mol %) | Ce molar fraction (mol %) | Y molar fraction (mol %) | Thickness of light emitting member (mm) | Fluorescence output (mW) | | Fluorescence output molar fraction (%) | | Comprehensive evaluation |
|---|---|---|---|---|---|---|---|---|---|
| Example 1 | 75 | 0.2 | bal. | 0.2 | 35.6 | A | 94.2 | A | A |
| Example 2 | 80 | 0.2 | bal. | 0.2 | 38.0 | A | 95.4 | A | A |
| Example 3 | 85 | 0.2 | bal. | 0.2 | 36.2 | A | 93.6 | A | A |
| Example 4 | 80 | 0.02 | bal. | 0.2 | 32.3 | A | 96.1 | A | A |
| Example 5 | 80 | 0.4 | bal. | 0.2 | 33.6 | A | 90.3 | A | A |
| Example 6 | 80 | 0.2 | bal. | 0.1 | 32.3 | A | 96.0 | A | A |
| Example 7 | 80 | 0.2 | bal. | 0.35 | 33.2 | A | 92.3 | A | A |
| Comparative Example 1 | 70 | 0.2 | bal. | 0.2 | 33.3 | A | 88.1 | B | B |
| Comparative Example 2 | 90 | 0.2 | bal. | 0.2 | 28.8 | B | 87.9 | B | B |
| Comparative | 80 | 0.01 | bal. | 0.2 | 29.3 | B | 96.5 | A | B |

TABLE 1-continued

| | Al molar fraction (mol %) | Ce molar fraction (mol %) | Y molar fraction (mol %) | Thickness of light emitting member (mm) | Fluorescence output (mW) | | Fluorescence output molar fraction (%) | | Comprehensive evaluation |
|---|---|---|---|---|---|---|---|---|---|
| Example 3 Comparative Example 4 | 80 | 0.45 | bal. | 0.2 | 29.6 | B | 86.2 | B | B |
| Comparative Example 5 | 80 | 0.2 | bal. | 0.05 | 28.6 | B | 95.3 | A | B |
| Comparative Example 6 | 80 | 0.2 | bal. | 0.4 | 29.4 | B | 89.0 | B | B |

When Examples 1 to 3 are compared with Comparative examples 1 and 2, it is found that, in a case where the Al molar fraction is 75 mol % to 85 mol %, the fluorescence output and the fluorescence output molar fraction are favorable. In Comparative example 1 in which the Al molar fraction is 70 mol %, since the Al molar fraction is in a range where the amount of YAG is in excess than the amount at the eutectic point of $Al_2O_3$ having the luminescent center and YAG not having the luminescent center, coarsening of YAG occurs. Then, the contacting area between $Al_2O_3$ and YAG becomes relatively small. Conduction of the heat generated at the time of light emission is suppressed, and it becomes difficult to dissipate the heat. Accordingly, the fluorescence output molar fraction decreases. In Comparative example 2 in which the Al molar fraction is 90 mol %, since the Al molar fraction is in a range where the amount of $Al_2O_3$ is in excess than the amount at the eutectic point of $Al_2O_3$ not having the luminescent center and YAG having the luminescent center, coarsening of $Al_2O_3$ occurs. Then, the proportion of YAG having the luminescent center becomes relatively small, and the contacting area between $Al_2O_3$ and YAG becomes small. Therefore, the fluorescence output and the fluorescence output molar fraction decrease together.

When Examples 4 and 5 are compared with Comparative examples 3 and 4, in a case where the Ce molar fraction is 0.02 mol % to 0.4 mol %, the fluorescence output and the fluorescence output molar fraction are favorable. In Comparative example 3 in which the Ce molar fraction is 0.01 mol %, since the amount of Ce acting as the luminescent center in YAG is small, the fluorescence output decreases. In Comparative example 4 in which the Ce molar fraction is 0.45 mol %, the amount of Ce acting as the luminescent center in YAG is large. However, in a case where the concentration of the luminescent center increases in YAG, the amount of adjacent Ce increases. In a case where the electrons transit from a ground state to an excitation state, electron cloud spreads. However, in a case where the amount of adjacent Ce increases, the spread electron clouds overlap with each other. Therefore, the probability that the electrons in excitation state move to the adjacent electron cloud increases, and the electrons are deactivated before returning to the ground state in some cases. Accordingly, the fluorescence output and the fluorescence output molar fraction decrease.

When Examples 6 and 7 are compared with Comparative examples 5 and 6, in a case where the thickness of light emitting member is 0.1 mm to 0.35 mm, the fluorescence output and the fluorescence output molar fraction are favorable. In Comparative example 5 in which the thickness of the light emitting member is 0.05 mm, since the thickness is small and the probability that the YAG containing Ce having the luminescent center is irradiated with the excitation light decreases, the fluorescence output decreases. In Comparative example 6 in which the thickness of the light emitting member is 0.4 mm, since the thickness is large and the fluorescence propagates in a transverse direction of the light emitting member, the fluorescence output that can be detected in the direction of light transmitting member decreases. In addition, the thickness increases, thereby increasing an effect of thermal storage. Therefore, the fluorescence output molar fraction decreases. That is, in a case where the Al molar fraction of the light emitting member is 75 mol % to 85 mol %, the Ce molar fraction is 0.02 mol % to 0.4 mol %, the balance includes Y, and the thickness of the light emitting member is 0.1 mm to 0.35 mm, light emitting element exhibiting excellent fluorescence output and fluorescence output molar fraction is obtained.

The light emitting element of the present disclosure is excellent in the fluorescence output and the fluorescence output molar fraction. In addition, the light emitting element emits yellow fluorescence when irradiated with blue light, and has excellent performance to obtain the white light. Therefore, there is a high possibility to use the light emitting element as a lighting for a vehicle.

What is claimed is:
1. A light emitting element comprising:
  a light emitting member that is formed of at least two kinds of an oxide material and has a plate shape; and
  a light transmitting member that collimates a light emitted from the light emitting member and has a plano-convex shape,
  wherein a contact portion between the light transmitting member and the light emitting member is continuous,
  wherein the light emitting member is formed of at least one material not having a luminescent center and a material having the luminescent center, and
  wherein the light transmitting member is formed of a material substantially the same as the material of the light emitting member, not having the luminescent center.
2. The light emitting element of claim 1,
  wherein in the contact portion, the material not having the luminescent center and the material having the luminescent center are distributed in a state of being three-dimensionally entwined with each other.
3. The light emitting element of claim 1,
  wherein the material not having the luminescent center is $Al_2O_3$, and
  wherein the material having the luminescent center is $Y_3Al_5O_{12}$ containing Ce.
4. The light emitting element of claim 2,
  wherein the material not having the luminescent center is $Al_2O_3$, and wherein the material having the luminescent center is $Y_3Al_5O_{12}$ containing Ce.

* * * * *